(12) United States Patent  (10) Patent No.: US 9,246,516 B2
Kwok  (45) Date of Patent: Jan. 26, 2016

(54) TECHNIQUES FOR ERROR CORRECTION OF ENCODED DATA

(71) Applicant: Intel Corporation, Santa Clara, CA (US)

(72) Inventor: Zion S. Kwok, Burnaby (CA)

(73) Assignee: INTEL CORPORATION, Santa Clara, CA (US)

( * ) Notice: Subject to any disclaimer, the term of this patent is extended or adjusted under 35 U.S.C. 154(b) by 70 days.

(21) Appl. No.: 13/723,062

(22) Filed: Dec. 20, 2012

(65) Prior Publication Data

US 2014/0181614 A1  Jun. 26, 2014

(51) Int. Cl.
*H03M 13/00* (2006.01)
*H03M 13/15* (2006.01)
*H03M 13/37* (2006.01)

(52) U.S. Cl.
CPC ........ *H03M 13/1515* (2013.01); *H03M 13/152* (2013.01); *H03M 13/1575* (2013.01); *H03M 13/3715* (2013.01); *H03M 13/6502* (2013.01); *H03M 13/153* (2013.01); *H03M 13/1545* (2013.01)

(58) Field of Classification Search
None
See application file for complete search history.

(56) References Cited

U.S. PATENT DOCUMENTS

| | | | |
|---|---|---|---|
| 4,509,172 A * | 4/1985 | Chen ............................. | 714/759 |
| 5,099,484 A * | 3/1992 | Smelser ........................ | 714/761 |
| 5,841,795 A * | 11/1998 | Olarig et al. .................. | 714/768 |
| 5,905,858 A * | 5/1999 | Jeddeloh ........................ | 714/52 |
| 6,640,327 B1 | 10/2003 | Hallberg | |
| 6,990,624 B2 | 1/2006 | Dohmen et al. | |
| 7,206,992 B2 | 4/2007 | Xin | |
| 7,694,205 B2 * | 4/2010 | Cideciyan et al. ............ | 714/769 |
| 7,865,809 B1 | 1/2011 | Lee et al. | |
| 8,010,875 B2 * | 8/2011 | Gara et al. ..................... | 714/773 |
| 8,381,064 B2 * | 2/2013 | Hazelzet ........................ | 714/753 |
| 8,464,136 B2 | 6/2013 | Tsai et al. | |
| 8,677,205 B2 * | 3/2014 | Ramaraju et al. ............. | 714/755 |
| 2003/0101406 A1 | 5/2003 | Song | |
| 2004/0003337 A1 * | 1/2004 | Cypher .......................... | 714/763 |
| 2004/0153902 A1 | 8/2004 | Machado et al. | |
| 2004/0237022 A1 | 11/2004 | Karpuszka et al. | |
| 2009/0292971 A1 | 11/2009 | Man et al. | |
| 2010/0241932 A1 | 9/2010 | Sakaue et al. | |
| 2010/0332944 A1 * | 12/2010 | Cypher et al. ................ | 714/763 |
| 2011/0307758 A1 * | 12/2011 | Fillingim ...................... | 714/758 |
| 2012/0074810 A1 | 3/2012 | Chen et al. | |

* cited by examiner

*Primary Examiner* — Daniel McMahon
(74) *Attorney, Agent, or Firm* — Kacvinsky Daisak Bluni PLLC

(57) ABSTRACT

Techniques for error correction of encoded data are described. In some examples, error correction code (ECC) information for the ECC encoded data is received that indicates the ECC encoded data includes one or more errors. A determination is then made as to whether the ECC encoded data includes a single error, two errors or more than two errors. If the ECC encoded data includes a single error, an error location of the error is identified. If the ECC encoded data includes two errors, first and second error locations are identified. If the ECC encoded data includes more than two errors, separate error locations are identified for the more than two errors. The single error, the two errors or the more than two errors is/are corrected and the ECC encoded data is then be decoded.

21 Claims, 9 Drawing Sheets

800

- RECEIVE ECC INFORMATION FOR ECC ENCODED DATA INDICATING ONE OR MORE ERRORS IN THE ECC ENCODED DATA
  802

- DETERMINE WHETHER THE ECC ENCODED DATA INCLUDES A SINGLE ERROR OR TWO ERRORS
  804

- BASED ON A DETERMINATION OF A SINGLE ERROR, IDENTIFY AN ERROR LOCATION FOR THE SINGLE ERROR IN THE ECC ENCODED DATA OR GENERATE A FIRST INDICATION THAT THE ECC ENCODED DATA HAS MORE THAN ONE ERROR
  806
  - CORRECT THE SINGLE ERROR BASED ON THE IDENTIFIED ERROR LOCATION AND DECODE THE ECC ENCODED DATA
    808

- BASED ON A DETERMINATION OF TWO ERRORS, IDENTIFY A FIRST LOCATION AND A SECOND LOCATION FOR THE TWO ERRORS IN THE ECC ENCODED DATA OR GENERATE A SECOND INDICATION THAT THE ECC ENCODED DATA HAS MORE THAN TWO ERRORS
  810
  - CORRECT THE TWO ERRORS BASED ON THE IDENTIFIED FIRST AND SECOND ERROR LOCATIONS AND DECODE THE ECC ENCODED DATA
    812

- IDENTIFY SEPARATE ERROR LOCATIONS FOR THE MORE THAN TWO ERRORS IN THE ECC ENCODED DATA RESPONSIVE TO THE SECOND INDICATION
  814
  - CORRECT THE MORE THAN TWO ERRORS BASED ON THE SEPARATELY IDENTIFIED ERROR LOCATIONS AND DECODE THE ECC ENCODED DATA
    816

*FIG. 8*

Storage Medium 900

*Computer Executable Instructions for 800*

FIG. 9

Computing Platform 1000

Processing Component 1040

Apparatus 700

Storage Medium 900

Memory System 1030

Apparatus 700

Other Platform Components 1050

Communications Interface 1060

FIG. 10

TECHNIQUES FOR ERROR CORRECTION OF ENCODED DATA

RELATED CASE

This application is related to commonly owned U.S. patent application Ser. No. 13/629,688, filed on Sep. 28, 2012 and entitled "Techniques Associated with Error Correction for Encoded Data".

BACKGROUND

An error correction code (ECC) may be used to protect data or recover from errors related to a medium via which the data was either transmitted or stored. For example, data may be encoded using an ECC to possibly recover from errors associated with wired/wireless communications, storage to memory devices/mediums or optical readers such as 2-dimensional bar code readers. ECC encoded data received by either reading data from a memory device/medium or barcode or received via a wired/wireless communication channel may be able to identify and correct a given number of errors. Typically, ECC encoded data may include codewords having a combination of data and redundant or parity bits or symbols. Depending on the size of a given codeword and the level of protection desired, codewords may vary in size and also may vary in the complexity of algorithms used to recover from possible errors.

Errors in a given period of time may be referred to as a bit error rate (BER). Technological advances in digital signal transmissions that have greatly increased data transmission speeds have also increased the possibility of a higher BER. Also, memory storage/medium technologies have resulted in increasingly denser storage that may also lead to an increased possibility of a higher BER. In order to reduce the impacts of possibly higher BERs, data may be encoded in larger codewords. These larger codewords may have more parity bits. Large codewords with more parity bits may require complex algorithms implemented with increasing amounts of computing resources. It is with respect to these and other challenges that the embodiments described herein are needed.

BRIEF DESCRIPTION OF THE DRAWINGS

FIG. 8 illustrates an example logic flow.
FIG. 9 illustrates an example storage medium.
FIG. 10 illustrates an example computing platform.

DETAILED DESCRIPTION

As contemplated in the present disclosure, large codewords with more parity bits may require complex algorithms implemented with increasing amounts of computing resources in order to reduce BERs. In some examples, users of memory storage technologies seek a balance between reducing BERs yet minimizing latencies possibly caused by using increasing amounts of computing resources (e.g., processor clock cycles). Some memory storage technologies such as those associated with non-volatile memories (e.g., 3-dimensional cross-point memory) may have relatively fast data access times but inherent physical characteristics of the non-volatile memories may lead to a higher potential for BERs. Thus, relatively large codewords are used to protect data and counteract the higher potential for BERs. However, more computing resources may be used to decode these large codewords when errors are detected. The use of more computing resources may increase access times to unacceptable levels for some desired uses of at least some types of non-volatile memory, e.g., two level memory (2LM) or solid state drive (SSD) used for storage and/or system memory. It is with respect to these and other challenges that the examples described herein are needed.

In some examples, techniques for error correction of encoded data may be implemented. These techniques may include receiving, at circuitry for a memory system, error correction code (ECC) information for ECC encoded data indicating one or more errors in the ECC encoded data. A determination may then be made as to whether the ECC encoded data includes a single error or two errors. Based on the determination, a location for a single error in the ECC encoded data may be identified or a first indication that the ECC encoded data includes more than one error may be generated. Also, based on the determination, a first location and a second location for two errors in the ECC encoded data may be identified or a second indication that the ECC encoded data includes more than two errors may be generated. For examples of the ECC encoded data including more than two errors, separate error locations may be identified for each error. The one or more errors may then be corrected and the ECC encoded data may be decoded.

Figure 1:
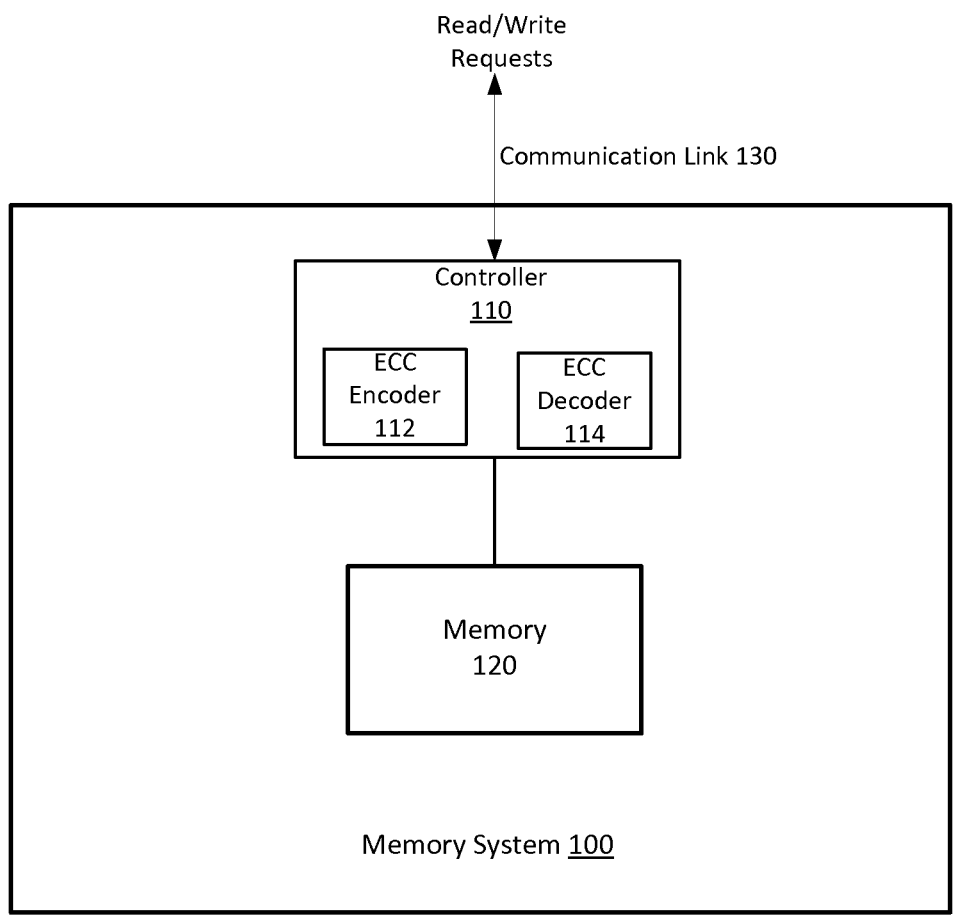
FIG. 1 illustrates an example memory system.

FIG. 1 illustrates an example memory system 100. As shown in FIG. 1, memory system 100 includes a controller 110 and a memory 120. According to some examples, controller 110 may receive and/or fulfill read/write requests via communication link 130. Although not shown in FIG. 1, in some examples, communication link 130 may communicatively couple controller 110 to elements or features associated with an operating system for a computing device. For these examples, memory system 100 may be a memory device for the computing device. As a memory device, memory system 100 may serve as a two level memory (2LM) system or a solid state drive (SSD) for the computing device.

In some examples, as shown in FIG. 1, controller 110 may include an error correction code (ECC) encoder 112 and an ECC decoder 114. ECC encoder 112 may include logic and/or features to generate codewords to protect data to be written to memory 120. As described in more detail below, ECC decoder 114 may include logic and/or features to detect, locate, possibly evaluate and correct errors included in ECC encoded data. According to some examples, the ECC used to encode the data may include, but is not limited to, Reed-Solomon (RS) codes or binary Bose, Chaudhuri, and Hocquenghem (BCH) codes.

In some examples, memory 120 may include non-volatile and/or volatile types of memory. Non-volatile types of memory may include, but are not limited to, 3-dimensional cross-point memory, flash memory, ferroelectric memory, silicon-oxide-nitride-oxide-silicon (SONOS) memory, polymer memory such as ferroelectric polymer memory, nanowire, ferroelectric transistor random access memory (FeTRAM or FeRAM), ovonic memory, nanowire or electrically erasable programmable read-only memory (EEPROM). Volatile types of memory may include, but are not limited to, dynamic random access memory (DRAM) or static RAM (SRAM).

In some examples, memory 120 may also include types of storage mediums such as optical discs to include, but not limited to, compact discs (CDs), digital versatile discs (DVDs), a high definition DVD (HD DVD) or a Blu-ray disc.

According to some examples where memory system 100 is configured as a 2LM system, memory system 100 may serve as main memory for a computing device. For these examples, memory 120 may include the two levels of memory including cached subsets of system disk level storage. In this configuration, the main memory may include "near memory" arranged to include volatile types on memory and "far memory" arranged to include volatile or non-volatile types of memory. The far memory may include volatile or non-volatile memory that may be larger and possibly slower than the volatile memory included in the near memory. The far memory may be presented as "main memory" to an operating system (OS) for the computing device while the near memory is a cache for the far memory that is transparent to the OS. The management of the 2LM system may be done by a combination of logic and modules executed via either controller 110 and/or processing circuitry (e.g., a CPU) for the computing device. Near memory may be coupled to the processing circuitry via high bandwidth, low latency means for efficient processing. Far memory may be coupled to the processing circuitry via low bandwidth, high latency means.

Figure 2:
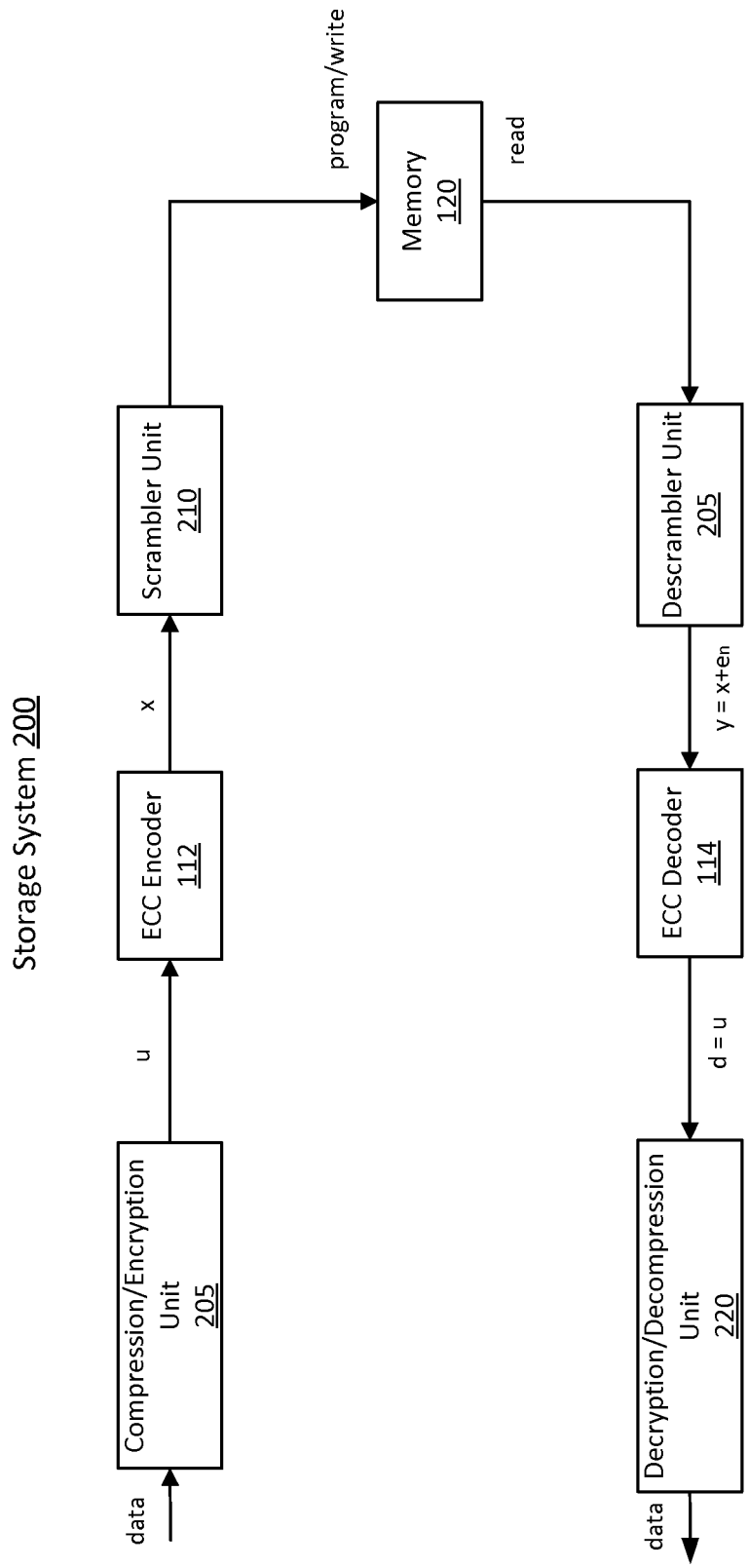
FIG. 2 illustrates an example storage system.

FIG. 2 illustrates an example storage system. In some examples, as shown in FIG. 2, storage system 200 includes a compression/encryption unit 205, ECC encoder 112, a scrambler unit 210, memory 120, a descrambler unit 205, ECC decoder 114 and a decryption/decompression unit 220.

According to some examples, as shown in FIG. 2, compression/encryption of data at compression/encryption unit 205 may result in "u". ECC encoder 112 may receive u and generate a codeword "x" using an ECC code (e.g., binary BCH or RS). Scrambler unit 210 may receive x and cause x to be programmed or written to memory 120. The codeword may be read from memory 120 and descrambled by descrambler unit 205 to result in a codeword "y". As shown in FIG. 2, y=x+$e_n$, where "$e_n$" represents errors possibly introduced during the writing then reading of x from memory 120 and "n" represents the number of errors introduced during the writes and reads from memory 120. ECC decoder 114 may receive y and possibly correct identified errors to generate "d". As shown in FIG. 2, if the errors were correctable, d=u. Decryption/Decompression unit 220 may then decrypt/decompress u to generate data originally compressed/encrypted by compression/encryption unit 205.

In some examples, ECC decoder 114 may include logic and/or features to receive ECC encoded data y having $e_n$. ECC decoder 114 may determine whether $e_n$ is a single error, two errors or multiple errors. For examples where $e_n$ is a single error, ECC decoder 114 may include logic and/or features to either identify an error location or error value in ECC encoded data y or generate a first flag to indicate that $e_n$ is more than a single error. ECC decoder 114 may also include logic and/or features to determine whether $e_n$ is two errors and then either identify first and second error locations or respective first and second error values in ECC encoded data y or generate a second flag to indicate that $e_n$ is more than two errors. Based on the first and second flags being generated, ECC decoder 114 may go through a more computing resource intensive ECC process to separately identify error locations and/or values in y.

The example described above, may be an iterative or parallel process. In an iterative process, logic and/or features of ECC decoder 114 may first attempt to identify a location or error value for a single error in y and then attempt to identify locations or error values for two errors in y before moving to a more resource intensive process of identifying error locations or values for more than two errors in y. In a parallel process, logic and/or features of ECC decoder 114 may have separate circuitry for single, double and multiple error location or error value determination. The single error circuitry may either identify a single error, its location/value or generate a first flag to indicate that more than one error exists. Meanwhile, the double and multiple error circuitry may also attempt to identify errors. The double error circuitry may either identify first and second error locations/values or generate a second flag to indicate that more than two errors exist. The multiple error circuitry may separately identify error locations/values concurrently. However, ECC decoder 114 may include logic and/or features to stop or ignore the double error circuitry and the multiple error circuitry if only a single error was identified. Also, the logic and/or features may stop or ignore the multiple error circuitry if only two errors were identified.

According to some examples, using either the iterative or parallel process may substantially reduce error correction latencies for types of memory that predominately have no more than two errors when errors are detected in ECC encoded data. The reduction in latency is due to the traditional use of error circuitry to identify error locations based on the worst case scenario of a number of errors that is substantially higher than two errors. For example, identification of the plurality of errors $e_n$ in y when the ECC used to decode y is either an RS code or a binary BCH code may use several processor clock cycles to identify up to the highest number of errors the RS code or binary BCH code was designed to locate (e.g., up to a few dozen errors in large codewords). For example, a Berlekamp-Massey algorithm (BMA) may be implemented by logic and/or features of ECC decoder 114 that includes a plurality of computations to generate error location polynomials. A Chien Search may then be implemented by ECC decoder 114 to locate the errors. Also, additional processor clock cycles may be used to identify an error value for located errors if the ECC used to decode y is the RS code.

Although FIG. 2, depicts ECC encoded data having errors possibly caused by writing/reading data to memory 120. Other types of ECC encoded data such as ECC encoded data associated with wired/wireless communications or ECC encoded data associated with optical readers for 2-dimensional bar coder readers are also contemplated.

In some examples, a single error identification process may be based on the type of ECC code used to both encode u and decode y. For example, for binary BCH codes, partial syndromes that identify errors in y may have properties shown below for example equation (1) when there is one error, where j is the location of the error.

Example Equation (1):

$$S_1 = \alpha^j$$
$$S_2 = \alpha^{2j}$$
$$S_3 = \alpha^{3j}$$
$$\ldots$$
$$S_{2t} = \alpha^{2tj}$$

According to some examples, to correct a single bit error, a check to see if the partial syndromes form a geometric series may be made. The error location j may be determined based on example algorithm or equation (2).

$$j = \alpha^j = \log S_1 \qquad \text{Example equation (2):}$$

In some examples, ECC decoder 114 may include logic and/or features to implement example equation (2) via use of a lookup table or a logarithm calculating unit.

According to some examples, in binary BCH, even partial syndromes are fully determined by odd partial syndromes, so there may be no need to check the even partial syndromes. For these examples, example equation (3) may check that:

Example Equation (3):

$$S_3 = (S_1)^3$$

$$S_5 = (S_1)^5$$

$$S_7 = (S_1)^7$$

$$\ldots$$

$$S_{2t-1} = (S_1)^{2t-1}$$

Also, in order to check for a geometric series, it may be shown by example equation (5) that:

Example Equation (4):

$$\alpha^{2j} = \frac{S_3}{S_1} = \frac{S_5}{S_3} = \frac{S_7}{S_5} = \ldots = \frac{S_{2t-1}}{S_{2t-3}}$$

However, checking for the geometric series using example equation (4) may require many divisions, which may be relatively expensive in terms of computing resources (e.g., clock cycles). Instead, example equation (5) may be used to check:

$$\alpha^{2tj} = S_1 S_{2t-1} = S_3 S_{2t-3} =$$
$$S_5 S_{2t-5} = \ldots = S_{2\lceil t/2 \rceil - 1} S_{2\lfloor t/2 \rfloor + 1} \qquad \text{Example equation (5):}$$

Example equation (5) would show that the first t odd partial syndromes and the second t odd partial syndromes are symmetric. Example equation (6) may then be used to check only that the first t odd partial syndromes form a geometric series.

$$\alpha^{(t+2)j} = S_1 S_{t+1} = S_3 S_{t-1} = S_5 S_{t-3} = \ldots =$$
$$S_{2\lceil t/2 \rceil - 1} S_{2\lfloor t/2 \rfloor/2 \rfloor + 1} \qquad \text{Example equation (6):}$$

The check using example equation (6) would show that the first ⌈t/2⌉ odd partial syndromes and the second ⌈t/2⌉ odd partial syndromes are symmetric. Then example equation (7) may be used to check only that the first ⌈t/2⌉ odd partial syndromes form a geometric series and continue to divide and conquer until it can be shown that $S_1$, $S_3$, and $S_5$ form a geometric series.

Example Equation (7):

$$e^2 \alpha^{(\lceil t/2 \rceil + 1)j} = S_1 S_{\lceil t/2 \rceil}$$
$$= S_2 S_{\lceil t/2 \rceil - 1}$$
$$= S_3 S_{\lceil t/2 \rceil - 2}$$
$$= \ldots$$
$$= S_{\lceil \lceil t/2 \rceil / 2 \rceil} S_{\lfloor \lceil t/2 \rceil / 2 \rfloor + 1}$$

$$\alpha^{6j} = S_1 S_5 = S_3^2$$

Further, to check that partial syndromes that form a geometric series match the form in example equation (3), check that example equation (8) is satisfied:

$$S_3 = (S_1)^3 \qquad \text{Example equation (8):}$$

According to some examples, single error correction for binary BCH codes may require (t−1) Galois field constant power functions and Galois field multipliers. The logic and/or features at decoder 114 may include (t−1) m-bit comparators and use of at least one lookup table or a logarithm calculating unit. According to some other examples, the logic and/or features at decoder 114 may include approximately t multipliers and t comparators or at least t−1 multipliers and t−1 comparators to multiply odd partial syndromes to check if the odd partial syndromes form a geometric series.

In some examples, for single error correction based on RS codes, partial syndromes that identify errors in y may have properties shown below for example equation (9) when there is one error, where j is the location of the error and e is the error value.

Example Equation (9):

$$S_1 = e \alpha^j$$

$$S_2 = e \alpha^{2j}$$

$$S_3 = e \alpha^{3j}$$

$$\ldots$$

$$S_{2t} = e \alpha^{2tj}$$

According to some examples, to correct a single error, example equation (10) may be used to check that the partial syndromes form a geometric series and then solve for e and j.

Example Equation (10):

$$\alpha^j = \frac{S_2}{S_1} = \frac{S_3}{S_2} = \frac{S_4}{S_3} = \ldots = \frac{S_{2t}}{S_{2t-1}}$$

However, checking for the geometric series using example equation (10) may require many divisions, which are relatively expensive in terms of computing resources. Instead, example equation (11) may be used to check:

$$e^2 \alpha^{(2t+1)j} = S_1 S_{2t} = S_3 S_{2t-2} = \ldots = S_t S_{t+1} \qquad \text{Example equation (11)}$$

Example equation (11) would show that the first t partial syndromes and the second t partial syndromes are symmetric. Example equation (12) may then be used to check only that the first t partial syndromes form a geometric series.

$$e^2 \alpha^{(t+2)j} = S_1 S_{t+1} = S_2 S_t = S_3 S_{t-1} = \ldots =$$
$$S_{\lceil (t-1)/2 \rceil} S_{\lfloor (t+1)/2 \rfloor + 1} \qquad \text{Example equation (12):}$$

The check using example equation (12) would show that the first ⌈t/2⌉ partial syndromes and the second ⌈t/2⌉ partial syndromes are symmetric. Then example equation (13) may be used to check only that the first ⌈t/2⌉ partial syndromes form a geometric series and continue to divide and conquer until it can be shown that $S_1$, $S_2$, and $S_3$ form a geometric series.

Example Equation (13):

$$e^2 \alpha^{(\lceil (t+1)/2 \rceil + 2)j} = S_1 S_{\lfloor (t+1)/2 \rfloor + 1}$$
$$= S_2 S_{\lceil t/2 \rceil - 1}$$
$$= S_3 S_{\lceil t/2 \rceil - 2}$$
$$= \ldots$$
$$= S_{\lceil (t+1)/2 \rceil} S_{\lfloor (\lceil (t+1)/2 \rceil + 1)/2 \rfloor + 1}$$

$$\ldots$$

$$e^2 \alpha^{4j} = S_1 S_3 = S_2^2$$

In some examples, example equation (14) may then be used to solve for e and j.

Example Equation (14):

$$e = \frac{e^2 \alpha^{2j}}{e \alpha^{2j}} = \frac{S_1^2}{S_2} = \frac{S_n^2}{S_{2n}}$$

$$\alpha^j = \frac{e \alpha^{3j}}{e \alpha^{2j}} = \frac{S_3}{S_2} = \frac{S_{n+1}}{S_n}$$

$$j = \log \frac{S_{n+1}}{S_n}$$

According to some examples, decoder 114 may include logic and/or features to implement single error correction for RS codes. The logic and/or features may include approximately 2t multipliers and 2t comparators or at least 2t−1 multipliers and 2t−1 comparators to multiply partial syndromes to check if the partial syndromes form a geometric series. The logic and/or features may also be capable of a constant squaring, a Galois Field inversion, and have two multipliers to calculate e and j.

In some examples, a double or two error identification process may be based on the type of ECC code used to both encode u and decode y. For example, for binary BCH codes, partial syndromes that identify errors in y may have properties shown below for example equation (15) when there are two errors, where $j_1$ is a first location of a first error and $j_2$ is a second location of a second error.

Example Equation (15):

$$S_1 = \alpha^{j_1} + \alpha^{j_2}$$

$$S_2 = \alpha^{2j_1} + \alpha^{2j_2}$$

$$S_3 = \alpha^{3j_1} + \alpha^{3j_2}$$

$$\ldots$$

$$S_{2t} = \alpha^{2tj_1} + \alpha^{2tj_2}$$

According to some examples, let $j_1 = j+k$ and $j_2 = j-k$, then calculate for j using example equation (16).

Example Equation (16):

$$S_1 = \alpha^{j+k} + \alpha^{j-k} = \alpha^j (\alpha^k + \alpha^{-k})$$

$$S_2 = \alpha^{2(j+k)} + \alpha^{2(j-k)} = \alpha^{2j} (\alpha^{2k} + \alpha^{-2k})$$

$$S_3 = \alpha^{3(j+k)} + \alpha^{3(j-k)} = \alpha^{3j} (\alpha^{3k} + \alpha^{-3k})$$

$$\ldots$$

$$S_{2t} = \alpha^{2t(j+k)} + \alpha^{2t(j-k)} = \alpha^{2tj} (\alpha^{2tk} + \alpha^{-2tk})$$

Then calculate:

$$S_1 S_3 + S_4 = \alpha^j (\alpha^k + \alpha^{-k}) \alpha^{3j} (\alpha^{3k} + \alpha^{-3k}) + \alpha^{4j} (\alpha^{4k} + \alpha^{-4k})$$

$$= \alpha^{4j} (\alpha^{4k} + \alpha^{2k} + \alpha^{-2k} + \alpha^{-4k}) + \alpha^{4j} (\alpha^{4k} + \alpha^{-4k})$$

$$= \alpha^{4j} (\alpha^{2k} + \alpha^{-2k})$$

$$\frac{\sqrt{S_1 S_3 + S_4}}{S_1} = \frac{\sqrt{\alpha^{4j} (\alpha^{2k} + \alpha^{-2k})}}{\alpha^j (\alpha^k + \alpha^{-k})} = \frac{\alpha^{2j} (\alpha^k + \alpha^{-k})}{\alpha^j (\alpha^k + \alpha^{-k})} = \alpha^j$$

In some examples, ECC decoder 114 may include logic and/or features to determine j from $\alpha^j$ derived using example equation (16) via use of a lookup table or a logarithm calculating unit.

According to some examples, the square root function can be implemented as sum of the square roots of each bit. Thus, example equation (17) shows that for any x in the Galois Field, where x is defined by $x_0$ to $x_{m-1}$.

Example Equation (17):

$$x = x_0 + x_1 \alpha + x_2 \alpha^2 + x_3 \alpha^3 + \ldots + x_{m-1} \alpha^{m-1}$$

$$x^2 = x_0 + x_1 \alpha^2 + x_2 \alpha^4 + x_3 \alpha^6 + \ldots + x_{m-1} \alpha^{2m-2}$$

$$\sqrt{x} = x_0 + x_1 \sqrt{\alpha} + x_2 \sqrt{\alpha^2} + x_3 \sqrt{\alpha^3} + \ldots + x_{m-1} \sqrt{\alpha^{m-1}}$$

In some examples, ECC decoder 114 may include logic and/or features to solve for k using example equation (18).

Example Equation (18):

$$\frac{\sqrt{S_1 S_3 + S_4}}{S_2} = \frac{\sqrt{\alpha^{4j} (\alpha^{2k} + \alpha^{-2k})}}{\alpha^{2j} (\alpha^{2k} + \alpha^{-2k})}$$

$$= \frac{\alpha^{2j} (\alpha^k + \alpha^{-k})}{\alpha^{2j} (\alpha^{2k} + \alpha^{-2k})}$$

$$= \frac{1}{\alpha^k + \alpha^{-k}}$$

According to some examples, ECC decoder 114 may include logic and/or features to find the value of k from $$\frac{1}{\alpha^k + \alpha^{-k}}.$$

Note that many values of $$\frac{1}{\alpha^k + \alpha^{-k}}$$

may not match a valid value of k, which would happen when the number of errors is not 2. For these examples, once a value for k is determined, a first error location $j_1$ may be determined by $j_1 = j+k$ and a second error location $j_2$ may be determined by $j_2 = j-k$.

In some examples, the error locator polynomial for binary BCH and two errors is shown by example equation (19).

Example Equation (19):

$$\sigma(x) = \sigma_0 + \sigma_1 x + \sigma_2 x^2$$

$$= (1 + \alpha^{j_1} x)(1 + \alpha^{j_2} x)$$

$$= (1 + \alpha^{j+k} x)(1 + \alpha^{j-k} x)$$

$$= 1 + (\alpha^{j+k} + \alpha^{j-k}) x + \alpha^{2j} x^2$$

$$= 1 + S_1 x + \alpha^{2j} x^2$$

$$\sigma_0 = 1$$

$$\sigma_1 = S_1$$

$$\sigma_2 = \alpha^{2j}$$

According to some examples, if implementing BMA, the values of $$\frac{1}{\alpha^k + \alpha^{-k}}$$

not matching a valid value of k, may result in a discrepancy being calculated over multiple iterations. If there are only two errors, then the discrepancy calculations for these iterations can be calculated more quickly by double error circuitry instead of over multiple clock cycles by multiple error circuitry configured to implement BMA. For example, logic and/or features of ECC decoder 114 may be capable of checking whether non-zero discrepancies, $\Delta^i$, shown in example equation (20) are equal to 0.

Example Equation (20):

$$\Delta^2 = S_3\sigma_0 + S_2\sigma_1 x + S_1\sigma_2 = 0?$$
$$\Delta^4 = S_5\sigma_0 + S_4\sigma_1 c + S_3\sigma_2 = 0?$$
$$\Delta^6 = S_7\sigma_0 + S_6\sigma_1 x + S_5\sigma_2 = 0?$$
$$\ldots$$
$$\Delta^{2t-2} = S_{2t-1}\sigma_0 + S_{2t-2}\sigma_1 x + S_{2t-3}\sigma_2 = 0?$$

Substituting values for $\sigma_0$, $\sigma_1$ and $\sigma_2$:

$$\Delta^2 = S_3 + S_2 S_1 + S_1 \alpha^{2j} = 0?$$
$$\Delta^4 = S_5 + S_4 S_1 + S_3 \alpha^{2j} = 0?$$
$$\Delta^6 = S_7 + S_6 S_1 + S_5 \alpha^{2j} = 0?$$
$$\ldots$$
$$\Delta^{2t-2} = S_{2t-1} + S_{2t-2} S_1 + S_{2t-3} \alpha^{2j} = 0?$$

In some examples, the logic and/or features at decoder 114 to implement double or two error correction for binary BCH codes may include 2t+1 multipliers, 2 inversions, 2 square roots, 1 logarithm, 1 custom lookup table, 1 square, (2t−1)m XOR gates, one (t−1)m input NOR gate, and two m-bit adders. These elements of double error circuitry may be implemented in combination or over several clock cycles. Either implementation is likely much faster than waiting for t BMA iterations to be implemented by multiple error circuitry.

In some examples, for double or two error correction based on RS codes, partial syndromes that identify errors in y may have properties shown below for example equation (21) when there are two errors, where $j_1$ is a first location of a first error and $j_2$ is a second location of a second error. Also $e_1$, may be a first error value associated with $j_1$ and $e_2$ may be a second error value associated with $j_2$.

Example Equation (21):

$$S_1 = e_1 \alpha^{j_1} + e_2 \alpha^{j_2}$$
$$S_2 = e_1 \alpha^{2j_1} + e_2 \alpha^{2j_2}$$
$$S_3 = e_1 \alpha^{3j_1} + e_2 \alpha^{3j_2}$$
$$\ldots$$
$$S_{2t} = e_1 \alpha^{2tj_1} + e_2 \alpha^{2tj_2}$$

According to some examples, let $j_1 = j+k$ and $j_2 = j-k$, then calculate for j using example equation (22).

Example Equation (22):

$$S_1 = e_1 \alpha^{j+k} + e_2 \alpha^{j-k} = \alpha^j (e_1 \alpha^k + e_2 \alpha^{-k})$$
$$S_2 = e_1 \alpha^{2(j+k)} + e_2 \alpha^{2(j-k)} = \alpha^{2j} (e_1 \alpha^{2k} + e_2 \alpha^{-2k})$$
$$S_3 = e_1 \alpha^{3(j+k)} + e_2 \alpha^{3(j-k)} = \alpha^{3j} (e_1 \alpha^{3k} + e_2 \alpha^{-3k})$$
$$\ldots$$
$$S_{2t} = e_1 \alpha^{2t(j+k)} + e_2 \alpha^{2t(j-k)} = \alpha^{2tj} (e_1 \alpha^{2tk} + e_2 \alpha^{-2tk})$$

Then calculate:

$$S_1 S_3 + S_2^2 = \alpha^j (e_1 \alpha^k + e_2 \alpha^{-k}) \alpha^{3j} (e_1 \alpha^{3k} + e_2 \alpha^{-3k}) +$$
$$[\alpha^{2j} (e_1 \alpha^{2k} + e_2 \alpha^{-2k})]^2$$
$$= \alpha^{4j} (e_1^2 \alpha^{4k} + e_1 e_2 \alpha^{2k} + e_1 e_2 \alpha^{-2k} + e_2^2 \alpha^{-4k}) +$$
$$\alpha^{4j} (e_1^2 \alpha^{4k} + e_2^2 \alpha^{-4k})$$
$$= \alpha^{4j} (e_1 e_2 \alpha^{2k} + e_1 e_2 \alpha^{-2k})$$
$$= \alpha^{4j} e_1 e_2 (\alpha^{2k} + \alpha^{-2k})$$

$$S_2 S_4 + S_3^2 = \alpha^{2j} (e_1 \alpha^{2k} + e_2 \alpha^{-2k}) \alpha^{4j} (e_1 \alpha^{4k} + e_2 \alpha^{-4k}) +$$
$$[\alpha^{3j} (e_1 \alpha^{3k} + e_2 \alpha^{-3k})]^2$$
$$= \alpha^{6j} (e_1^2 \alpha^{6k} + e_1 e_2 \alpha^{2k} + e_1 e_2 \alpha^{-2k} + e_2^2 \alpha^{-6k}) +$$
$$\alpha^{6j} (e_1^2 \alpha^{6k} + e_2^2 \alpha^{-6k})$$
$$= \alpha^{6j} (e_1 e_2 \alpha^{2k} + e_1 e_2 \alpha^{-2k})$$
$$= \alpha^{6j} e_1 e_2 (\alpha^{2k} + \alpha^{-2k})$$

$$S_1 S_5 + S_3^2 = \alpha^j (e_1 \alpha^k + e_2 \alpha^{-k}) \alpha^{5j} (e_1 \alpha^{5k} + e_2 \alpha^{-5k}) +$$
$$[\alpha^{3j} (e_1 \alpha^{3k} + e_2 \alpha^{-3k})]^2$$
$$= \alpha^{6j} (e_1^2 \alpha^{6k} + e_1 e_2 \alpha^{4k} + e_1 e_2 \alpha^{-4k} + e_2^2 \alpha^{-6k}) +$$
$$\alpha^{6j} (e_1^2 \alpha^{6k} + e_2^2 \alpha^{-6k})$$
$$= \alpha^{6j} (e_1 e_2 \alpha^{4k} + e_1 e_2 \alpha^{-4k})$$
$$= \alpha^{6j} e_1 e_2 (\alpha^{4k} + \alpha^{-4k})$$

$$S_3 S_5 + S_4^2 = \alpha^{3j} (e_1 \alpha^{3k} + e_2 \alpha^{-3k}) \alpha^{5j} (e_1 \alpha^{5k} + e_2 \alpha^{-5k}) +$$
$$[\alpha^{4j} (e_1 \alpha^{4k} + e_2 \alpha^{-4k})]^2$$
$$= \alpha^{8j} (e_1^2 \alpha^{8k} + e_1 e_2 \alpha^{2k} + e_1 e_2 \alpha^{-2k} + e_2^2 \alpha^{-8k}) +$$
$$\alpha^{8j} (e_1^2 \alpha^{8k} + e_2^2 \alpha^{-8k})$$
$$= \alpha^{8j} (e_1 e_2 \alpha^{2k} + e_1 e_2 \alpha^{-2k})$$
$$= \alpha^{8j} e_1 e_2 (\alpha^{2k} + \alpha^{-2k})$$

$$\sqrt{\frac{S_2 S_4 + S_3^2}{S_1 S_3 + S_2^2}} = \sqrt{\frac{\alpha^{6j} e_1 e_2 (\alpha^{2k} + \alpha^{-2k})}{\alpha^{4j} e_1 e_2 (\alpha^{2k} + \alpha^{-2k})}} = \sqrt{\alpha^{2j}} = \alpha^j$$

In some examples, ECC decoder 114 may include logic and/or features to determine j from $\alpha^j$ derived using example equation (22) via use of a lookup table or a logarithm calculating unit.

According to some examples, ECC decoder 114 may include logic and/or features to solve for k using example equation (23).

Example Equation (23):

$$\sqrt{\frac{S_1 S_5 + S_3^2}{S_2 S_4 + S_3^2}} = \sqrt{\frac{\alpha^{6j} e_1 e_2 (\alpha^{4k} + \alpha^{-4k})}{\alpha^{6j} e_1 e_2 (\alpha^{2k} + \alpha^{-2k})}}$$

-continued $$= \sqrt{\alpha^{2k} + \alpha^{-2k}}$$

$$= \alpha^k + \alpha^{-k}$$

In some examples, ECC decoder 114 may include logic and/or features to find the value of k from $\alpha^k + \alpha^{-k}$. Note that many values of $\alpha^k + \alpha^k$ may not match a valid value of k, which would happen when the number of errors is not 2.

According to some examples, the error locator polynomial for RS is shown by example equation (24).

Example Equation (24):

$$\sigma(x) = \sigma_0 + \sigma_1 x + \sigma_2 x^2$$
$$= (1 + \alpha^{j_1} x)(1 + \alpha^{j_2} x)$$
$$= (1 + \alpha^{j+k} x)(1 + \alpha^{j-k} x)$$
$$= 1 + (\alpha^{j+k} + \alpha^{j-k})x + \alpha^{2j} x^2$$
$$= 1 + \alpha^j (\alpha^k + \alpha^{-k})x + \alpha^{2j} x^2$$

$$\sigma_0 = 1$$
$$\sigma_1 = \alpha^j (\alpha^k + \alpha^{-k})$$
$$\sigma_2 = \alpha^{2j}$$

Example equation (25) may provide some useful identities.

Example Equation (25):

$$\sqrt{S_1 S_5 + S_3^2} = \sqrt{S_1 S_5} + S_3$$

$$\sqrt{\frac{S_1 S_5 + S_3^2}{S_1 S_3 + S_2^2}} = \sqrt{\frac{\alpha^{6j} e_1 e_2 (\alpha^{4k} + \alpha^{-4k})}{\alpha^{4j} e_1 e_2 (\alpha^{2k} + \alpha^{-2k})}}$$
$$= \sqrt{\alpha^{2j} (\alpha^{2k} + \alpha^{-2k})}$$
$$= \alpha^j (\alpha^k + \alpha^{-k})$$

$$\sqrt{\frac{S_2 S_6 + S_4^2}{S_1 S_3 + S_2^2}} = \sqrt{\frac{\alpha^{8j} e_1 e_2 (\alpha^{4k} + \alpha^{-4k})}{\alpha^{4j} e_1 e_2 (\alpha^{2k} + \alpha^{-2k})}}$$
$$= \sqrt{\alpha^{4j} (\alpha^{2k} + \alpha^{-2k})}$$
$$= \alpha^{2j} (\alpha^k + \alpha^{-k})$$

$$\sqrt{\frac{S_1 S_5 + S_3^2}{S_3 S_5 + S_4^2}} = \sqrt{\frac{\alpha^{6j} e_1 e_2 (\alpha^{4k} + \alpha^{-4k})}{\alpha^{8j} e_1 e_2 (\alpha^{2k} + \alpha^{-2k})}}$$
$$= \sqrt{\frac{\alpha^{2k} + \alpha^{-2k}}{\alpha^{2j}}}$$
$$= \frac{\alpha^k + \alpha^{-k}}{\alpha^j}$$

In some examples, if implementing BMA the values of $\alpha^k + \alpha^k$ not matching a valid value of k, may result in a discrepancy being calculated over multiple iterations. If there are only two errors, then the discrepancy calculations for these iterations can be calculated more quickly by double error circuitry instead of over multiple clock cycles by multiple error circuitry configured to implement BMA. For example, logic and/or features of ECC decoder 114 may be capable of checking whether non-zero discrepancies, $\Delta^1$, shown in example equation (26) are equal to 0.

Example Equation (26):

$$\Delta^2 = S_3 \sigma_0 + S_2 \sigma_1 x + S_1 \sigma_2 = 0?$$

$$\Delta^3 = S_4 \sigma_0 + S_3 \sigma_1 x + S_2 \sigma_2 = 0?$$

$$\Delta^4 = S_5 \sigma_0 + S_4 \sigma_1 x + S_3 \sigma_2 = 0?$$

$$\ldots$$

$$\Delta^{2t-1} = S_{2t} \sigma_0 + S_{2t-1} \sigma_1 x + S_{2t-2} \sigma_2 = 0?$$

Substituting values for $\sigma_0$, $\sigma_1$ and $\sigma_2$:

$$\Delta^2 = S_3 + S_2 \alpha^j (\alpha^k + \alpha^{-k}) + S_1 \alpha^{2j} = 0?$$

$$\Delta^3 = S_4 + S_3 \alpha^j (\alpha^k + \alpha^{-k}) + S_2 \alpha^{2j} = 0?$$

$$\Delta^4 = S_5 + S_4 \alpha^j (\alpha^k + \alpha^{-k}) + S_3 \alpha^{2j} = 0?$$

$$\ldots$$

$$\Delta^{2t-1} = S_{2t} + S_{2t-1} \alpha^j (\alpha^k + \alpha^{-k}) + S_{2t-2} \alpha^{2j} = 0?$$

Alternatively, check that:

$$\frac{\Delta^2}{\alpha^j (\alpha^k + \alpha^{-k})} = \frac{S_3}{\alpha^j (\alpha^k + \alpha^{-k})} + S_2 + \frac{S_1 \alpha^j}{\alpha^k + \alpha^{-k}} = 0?$$

$$\frac{\Delta^3}{\alpha^j (\alpha^k + \alpha^{-k})} = \frac{S_4}{\alpha^j (\alpha^k + \alpha^{-k})} + S_3 + \frac{S_2 \alpha^j}{\alpha^k + \alpha^{-k}} = 0?$$

$$\frac{\Delta^4}{\alpha^j (\alpha^k + \alpha^{-k})} = \frac{S_5}{\alpha^j (\alpha^k + \alpha^{-k})} + S_4 + \frac{S_3 \alpha^j}{\alpha^k + \alpha^{-k}} = 0?$$

$$\ldots$$

$$\frac{\Delta^{2t-1}}{\alpha^j (\alpha^k + \alpha^{-k})} = \frac{S_{2t}}{\alpha^j (\alpha^k + \alpha^{-k})} + S_{2t-1} + \frac{S_{2t-2} \alpha^j}{\alpha^k + \alpha^{-k}} = 0?$$

Calculate Z(x):

$$Z(x) = S_1 \sigma_0 + (S_2 \sigma_0 + S_1 \sigma_1)x = S_1 + [S_2 + S_1 \alpha^j (\alpha^k + \alpha^{-k})]x$$

Calculate $\sigma'(x)$:

$$\sigma'(x) = \sigma_1 = \alpha^j (\alpha^k + \alpha^{-k})$$

According to some examples, decoder 114 may include logic and/or features to then find first and second error values $e_1$ and $e_2$ using example equation (27).

Example Equation (27):

$$e_1 = \frac{Z(\alpha^{-(j+k)})}{\sigma'(\alpha^{-(j+k)})}$$
$$= \frac{S_1 + [S_2 + S_1 \alpha^j (\alpha^k + \alpha^{-k})] \alpha^{-(j+k)}}{\alpha^j (\alpha^k + \alpha^{-k})}$$
$$= \frac{S_1}{\alpha^j (\alpha^k + \alpha^{-k})} + \left( \frac{S_2}{\alpha^{2j} (\alpha^k + \alpha^{-k})} + \frac{S_1}{\alpha^j} \right) \alpha^{-k}$$

$$e_2 = \frac{Z(\alpha^{-(j-k)})}{\sigma'(\alpha^{-(j-k)})}$$
$$= \frac{S_1 + [S_2 + S_1 \alpha^j (\alpha^k + \alpha^{-k})] \alpha^{-(j-k)}}{\alpha^j (\alpha^k + \alpha^{-k})}$$
$$= \frac{S_1}{\alpha^j (\alpha^k + \alpha^{-k})} + \left( \frac{S_2}{\alpha^{2j} (\alpha^k + \alpha^{-k})} + \frac{S_1}{\alpha^j} \right) \alpha^k$$

In some examples, the logic and/or features at decoder 114 to implement double or two error correction for RS codes may include 4t+8 multipliers, 7 inversions, 2 square roots, 1 logarithm, 1 custom lookup table, 2 squares, (4t+2)m XOR gates, one (2t−2)m input NOR gate, and two m-bit adders. These elements of double error circuitry may be implemented in combination or over several clock cycles. Either implementation is likely much faster than waiting for 2t BMA iterations to be implemented by multiple error circuitry.

Figure 3:
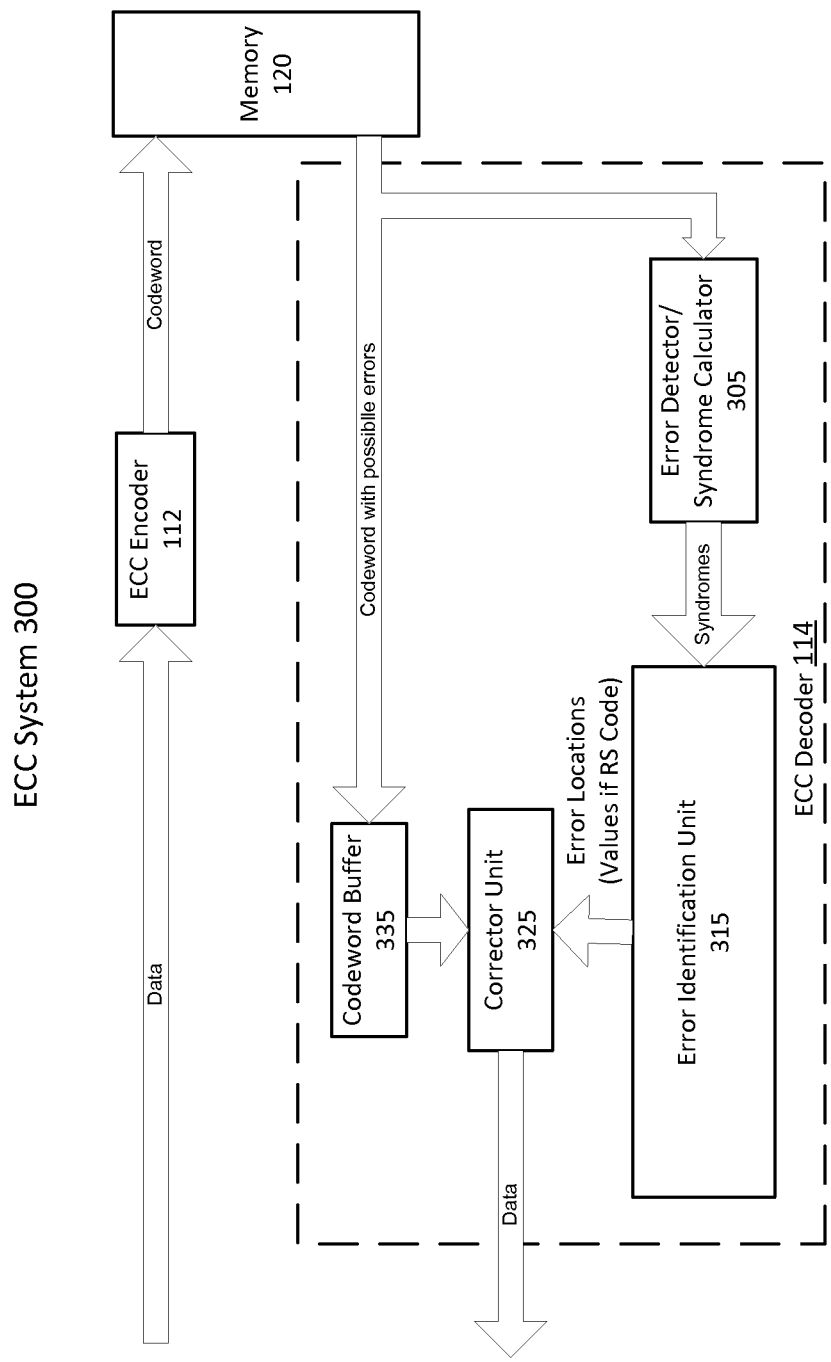
FIG. 3 illustrates an example error correction code (ECC) system.

FIG. 3 illustrates an example error correction code (ECC) system 300. In some examples, as shown in FIG. 3, ECC system 300 includes ECC encoder 112, memory 120 and ECC decoder 114. Also, ECC decoder 114 is shown as including an error detector/syndrome calculator 305, error identification unit 315, a corrector unit 325 and a codeword buffer 335.

In some examples, data (possibly encrypted/compressed) may be encoded by ECC encoder 112 using an ECC code that may include binary BCH codes or RS codes. The resultant codeword may then be stored to memory 120. According to some examples, the stored codeword may be read from memory 120 and may include possible errors. As shown in FIG. 3, the codeword with possible errors may be forwarded to codeword buffer 335. Codeword buffer 335 may be configured to at least temporarily store the codeword while other elements of ECC decoder 114 identify a location and/or a value for each error possibly included in the codeword.

According to some examples, error detector/syndrome calculator 305 may be configured to determine if the codeword includes any errors. For these examples, if no errors are detected, ECC decoder 114 may include logic and/or features to indicate to corrector unit 325 or codeword buffer 335 to forward the codeword being stored at codeword buffer 335. However, if errors are detected, error detector/syndrome calculator 305 may calculate partial syndromes for the ECC encoded data and forward the calculated partial syndromes to error identification unit 315. Error locations and/or values may then be identified by error identification module 315. As described more below, the error locations and/or values may be identified using either single error circuitry, double error circuitry or multiple error circuitry.

In some examples, as shown in FIG. 3, error locations and/or values may be provided to corrector unit 325 from error identification circuitry 315. For these examples, corrector unit 325 may be configured to correct identified errors based on the error locations and/or values. Corrector unit 325 may also be configured to decode the codeword and then forward the data for possible decompression/decryption and eventual delivery to the source of the read request.

Figure 4:
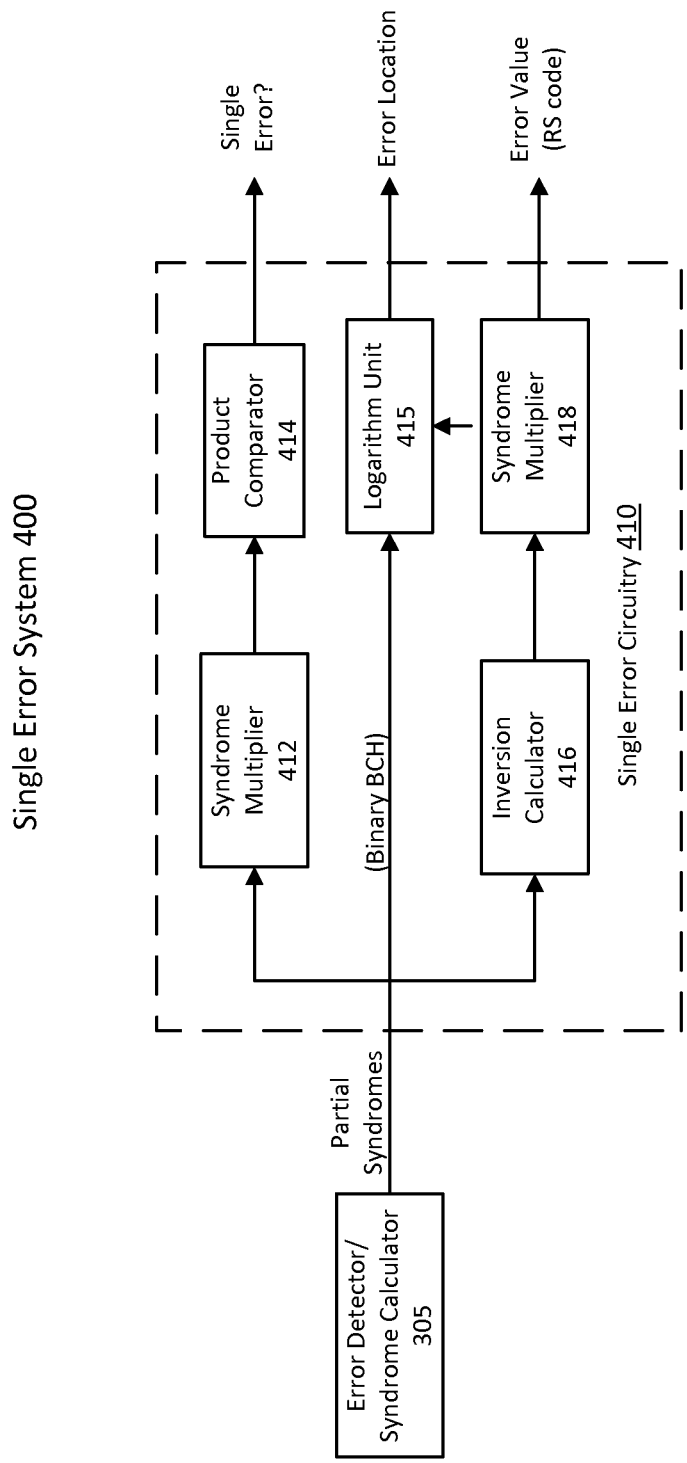
FIG. 4 illustrates an example single error system.

FIG. 4 illustrates an example single error system. In some examples, as shown in FIG. 4, single error system 400 includes error detector/syndrome calculator 305 to provide partial syndromes to single error circuitry 410. For these examples, single error circuitry 410 may be part of error identification unit 315 mentioned above for FIG. 3.

According to some examples, as shown in FIG. 4, single error circuitry 410 includes a syndrome multiplier 412, a product comparator 414, a logarithm unit 415, an inversion calculator 416 and a syndrome multiplier 418. In some examples, if the ECC used to encode ECC encoded data was based on binary BCH codes, syndrome multiplier 412, product comparator 414 and logarithm unit 415 may be used to determine whether the ECC encoded data includes a single error and to locate the single error based on this determination. For these examples, logarithm unit 415 may be arranged to determine the single error location based on partial syndromes received from error detector/syndrome calculator 305 and the implementation of example equation (2) to solve for j. Logarithm unit 415 may then forward the identified error location to corrector unit 325.

In some examples, if the ECC used to encode ECC encoded data included BCH codes, syndrome multiplier 412, product comparator 414 or logarithm unit 415, may be used to determine whether the ECC encoded data includes a single error, locate the single error and identify a location for the single error based on this determination. For these examples, logarithm unit 414 may be arranged to implement example equation (2) to calculate a value for j to determine the location of the single error. According to some examples, operations carried out at syndrome multiplier 412/product comparator 414 and logarithm unit 415 may occur in parallel and thus may be implemented by combinational circuitry.

In some examples, if the ECC used to encode ECC encoded data was based on RS codes, syndrome multiplier 412, product comparator 414, inversion calculator 416 and syndrome multiplier 418 may be used to determine whether the ECC encoded data includes a single error, locate the single error and identify a value for the single error based on this determination. For these examples, calculator 416 may be arranged to perform Galois field inversions according to example equation (14) and syndrome multiplier 418 may calculate values for e and j to determine the value and location of the single error and then forward the identified error location and value to corrector unit 325. According to some examples, operations carried out at syndrome multiplier 412/ product comparator 414 and logarithm unit 415/inversion calculator 416/syndrome multiplier 418 may occur in parallel and thus may be implemented by combinational circuitry.

According to some examples, if more than one error is identified, single error circuitry 410 may be configured or arranged to generate a more than one error flag. As described more below, responsive to the more than one error flag, double error circuitry or multiple error circuitry may be configured to locate and/or identify values for the full number of t possible errors protected by the particular ECC used.

Figure 5:
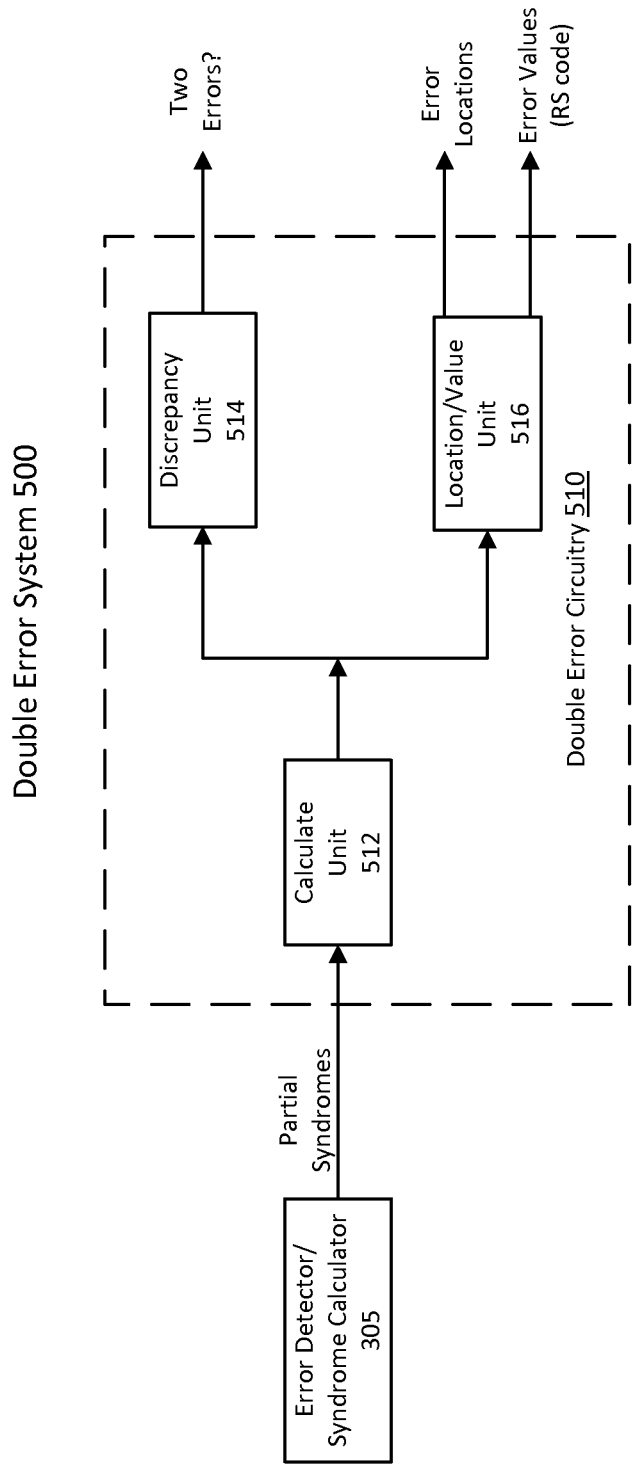
FIG. 5 illustrates an example double error system.

FIG. 5 illustrates an example double error system 500. In some examples, as shown in FIG. 5, double error system 500 includes error detector/syndrome calculator 305 to provide partial syndromes to double error circuitry 510. For these examples, double error circuitry 510 may be part of error identification unit 315 mentioned above for FIG. 3.

According to some examples, as shown in FIG. 5, double error circuitry 510 includes a calculate unit 512, a discrepancy unit 514 and a location/value unit 516. In some examples, if the ECC used to encode ECC encoded data was based on binary BCH codes, calculate unit 512 may implement example equations (16) and (18) to solve for j and k when a location of a first error $j_1 = j+k$ and a location of a second error $j_2 = j-k$. Location/value unit 516 may then calculate first error location $j_1 = j+k$ and second error location $j_2 = j-k$ and the first and second error locations may then be forwarded to corrector unit 325.

In some examples, discrepancy unit 514 may determine whether values of $$\frac{1}{\alpha^k + \alpha^{-k}}$$

may match a valid value of k determined by calculate unit 512. As mentioned previously, if more than two errors are included in the encoded data, many values of $$\frac{1}{\alpha^k + \alpha^{-k}}$$

may not match a valid value of k and thus discrepancies will exist. For these examples, discrepancy unit 514 may implement example equation (20) to check for non-zero discrepancies. If a non-zero discrepancy is determined, discrepancy unit 514 may generate an indication or flag to indicate that more than two errors are included in the data. This flag, for example, may indicate to logic and/or features of error identification unit 315 that multiple error circuitry is needed to separately identify locations for more than two errors in the encoded data.

In some examples, if the ECC used to encode ECC encoded data was based on RS codes, calculate unit 512 may implement example equations (22) and (23) to solve for j and k when a location of a first error $j_1=j+k$ and a location of a second error $j_2=j-k$. Location/value unit 516 may then calculate first error location $j_1=j+k$ and second error location $j_2=j-k$ and the first and second error locations may then be forwarded to corrector unit 325.

In some examples, discrepancy unit 514 may determine whether values of $\alpha^k+\alpha^{-k}$ may match a valid value of k determined by calculate unit 512. As mentioned previously, if more than two errors are included in the encoded data many values of $\alpha^k+\alpha^{-k}$ may not match a valid value of k and thus non-zero discrepancies may exist. For these examples, discrepancy unit 514 may implement example equation (26) to check for non-zero discrepancies. If a non-zero discrepancy is determined, discrepancy unit 514 may generate an indication or flag to indicate that more than two errors are included in the encoded data. This flag, for example, may indicate to logic and/or features of error identification unit 315 that multiple error circuitry is needed to separately identify locations for more than two errors in the encoded data.

According to some examples, location/value unit 516 may also implement example equation (27) to determine a first error value $e_1$ for location $j_1$ and a second error value $e_2$ for location $j_2$. For these examples, the first and second error values may then be forwarded to corrector unit 325.

According to some examples, operations carried out at discrepancy unit 514 and location/value unit 516 for encoded data encoded based on either binary BCH codes or RS codes may occur in parallel and thus may be implemented by combinational circuitry.

Figure 6:
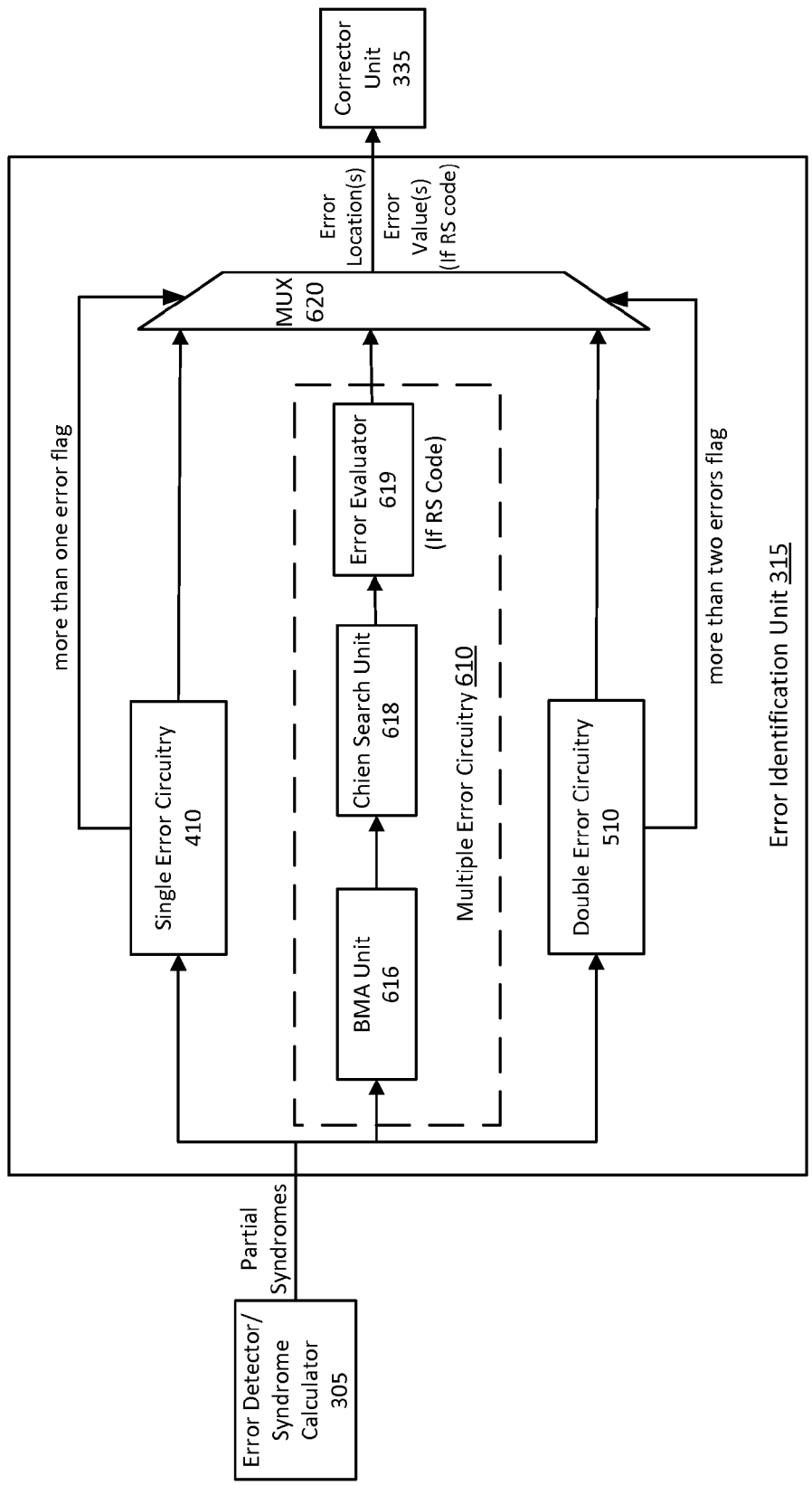
FIG. 6 illustrates an example single/double/multiple error system.

FIG. 6 illustrates an example single/double/multiple error system 600. In some examples, as shown in FIG. 6, single/double/multiple error system 600 includes error detector/syndrome calculator 305, error identification unit 315 and corrector unit 335. Also as shown in FIG. 6, error identification unit 315 include single error circuitry 410, double error circuitry 510, multiple error circuitry 610 and multiplexer (MUX) 620. For these examples, multiple error circuitry 610 is shown in FIG. 6 as including a Berlekamp-Massey algorithm (BMA) unit 616, a Chien Search unit 618 and an error evaluator 619.

According to some examples, error detector/syndrome calculator 305 may detect that one or more errors may be included in ECC encoded data and generate partial syndromes that indicate the one or more errors. For these examples, single error circuitry 410 or double error circuitry 510 may quickly determine if the partial syndromes indicate either a single error or two errors and identify error location(s) and/or value(s) for the single error or the two errors. MUX 620 may be arranged, to allow information from single error circuitry 410 to pass to corrector unit 335 by default, e.g., a first selector bit not asserted on MUX 620. However, if more than one error is found in the ECC encoded data, single error circuitry 410 may generate a more than one error flag that may assert the first selector bit and result in MUX 620 blocking any signals inputted to MUX 620 from single error circuitry 410. In a similar manner, if more than two errors are found in the ECC encoded data, double error circuitry 510 may generate a more than two errors flag that may assert a second selector bit and result in MUX 620 also blocking any signals inputted from double error circuitry 510. Responsive to both the first and second selector bits being asserted, error identification unit 315 may allow information from multiple error circuitry 610 to pass to corrector unit 335.

In some examples, the ECC encoded data may have been protected using a binary BCH code capable of protecting the encoded data from t errors. For these examples, BMA unit 616 and Chien Search unit 618 may be arranged to identify separate locations of errors included in the ECC encoded data up to at least the t errors.

In some examples, the ECC encoded data may have been protected using a RS code capable of protecting the encoded data from t errors. For these examples, BMA unit 616, Chien Search unit 618 and error evaluator 619 may be arranged to identify separate locations and values of errors included in the ECC encoded data up to at least t errors. As mentioned above, MUX 620 may be arranged to permit multiple error circuitry 610 to pass/forward information indicating the identified error locations and values to corrector unit 335.

In some examples, other algorithms are schemes may be used to identify error locations and/or values in ECC encoded data. These other algorithms may include, but are not limited to, a Peterson-Goresntein-Zierler algorithm or a Euclidean algorithm.

Figure 7:
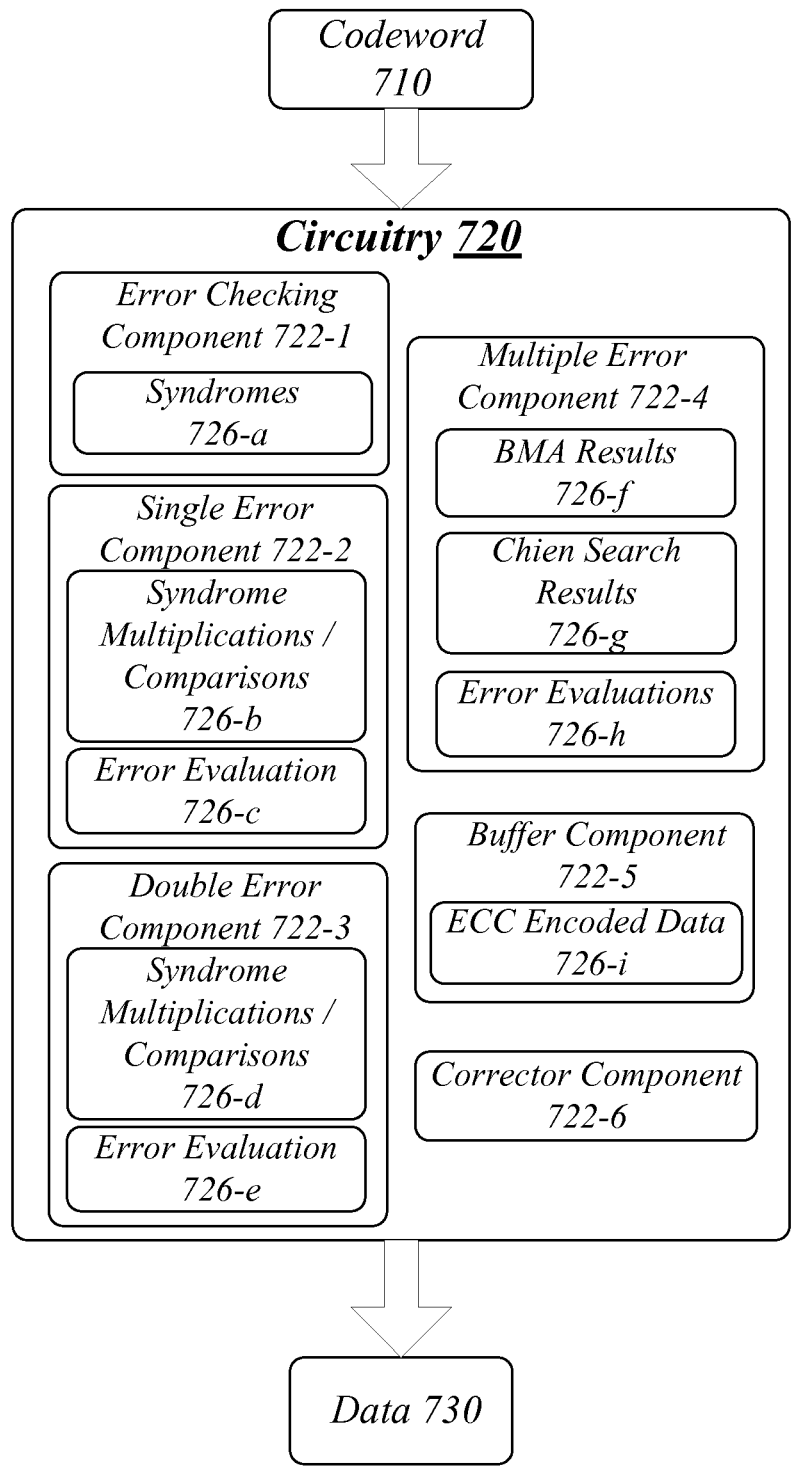
FIG. 7 illustrates an example apparatus.

FIG. 7 illustrates an example apparatus 700. Although the apparatus 700 shown in FIG. 7 has a limited number of elements in a certain topology, it may be appreciated that the apparatus 700 may include more or less elements in alternate topologies as desired for a given implementation.

The apparatus 700 may comprise a computer-implemented apparatus that may include at least some of the logic and/or features mentioned above for an ECC decoder 114 as mentioned above for FIGS. 1-6. The computer-implemented apparatus 700 may be arranged to execute one or more software components 722-a. It is worthy to note that "a" and "b" and "c" and similar designators as used herein are intended to be variables representing any positive integer. Thus, for example, if an implementation sets a value for a=6, then a complete set of software components 722-a may include modules 722-1, 722-2, 722-3, 722-4, 722-5 or 722-6. The embodiments are not limited in this context.

According to some examples, apparatus 700 may be capable of being located with a controller or ECC decoder for a memory system, e.g., as part of a memory system such as memory system 100. For these examples, apparatus 700 may be included in or implemented by circuitry 720 to include a processor, processor circuitry, microcontroller circuitry, an application-specific integrated circuit (ASIC) or a field programmable gate array (FPGA). In other examples, apparatus 700 may be implemented by circuitry 720 as part of firmware (e.g., BIOS), or implemented by circuitry 720 as a middleware application. The examples are not limited in this context.

In some examples, if implemented in a processor, the processor may be generally arranged to execute one or more software components 722-a. The processor can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel®, Atom Celeron®, Core (2) Duo®, Core i3, Core i5, Core i7, Pentium®, Xeon®, Xeon Phi®, Itanium® and XScale® processors; and similar processors. Multi-core processors and other multi-processor architectures may also be employed to implement apparatus 700.

According to some examples, apparatus 700 may include an error checking component 722-1. Error checking component 722-1 may be arranged for execution by circuitry 720 to determine that ECC encoded data received via codeword 710 may have one or more errors. For these examples, error checking component 722-1 may calculate partial syndromes that may result in non-zero values indicating errors in the ECC encoded data. These partial syndromes may at least be temporarily maintained as syndromes 726-a by error checking component 722-1 (e.g., stored in a data structure such as a register). In some examples, the partial syndromes may be based on codes for error correction such as binary BCH codes or RS codes.

In some examples, apparatus 700 may also include a single error component 722-2. Single error component 722-2 may be arranged for execution by circuitry 720 to receive ECC information for ECC encoded data indicating one or more errors in the ECC encoded data (e.g., included in partial syndromes). Single error component 722-2 may also be arranged to determine whether the ECC encoded data includes a single error, identify a location and/or value of the single error if the ECC encoded data was determined to have the single error. If the ECC information indicated more than one error, single error component 722-2 may be arranged to generate a flag to indicate the more than one error.

According to some examples, single error component 722-2 may at least temporarily maintain syndrome multiplications/comparisons 726-b and error evaluation 726-c (e.g., in a data structure such as a register). For these examples, if the ECC used to encode the ECC encoded data was a binary BCH code, multiplications/comparisons 726-b may include error location information for the single error. If the ECC used to encode the ECC encoded data was a RS code, error evaluation 726-c may include both error location and error value information for the single error.

In some examples, apparatus 700 may also include a double error component 722-3. Double error component 722-3 may be arranged for execution by circuitry 720 to receive ECC information for ECC encoded data indicating one or more errors in the ECC encoded data. Double error component 722-3 may also be arranged to determine whether the ECC encoded data includes two errors, identify a first location for a first error and a second location for a second error and/or values for the first and second errors if the ECC encoded data was determined to have the two errors. If the ECC information indicated more than two errors, double error component 722-3 may be arranged to generate a flag to indicate the more than two errors.

According to some examples, double error component 722-3 may at least temporarily maintain syndrome multiplications/comparisons 726-d and error evaluation 726-e (e.g., in a data structure such as a register). For these examples, if the ECC used to encode the ECC encoded data was a binary BCH code, error evaluations 726-e may include error location information for the two errors. If the ECC used to encode the ECC encoded data was a RS code, error evaluation 726-e may include both error location and error value information for the two errors.

In some examples, apparatus 700 may also include a multiple error component 722-4. Multiple error component 722-4 may be arranged for execution by circuitry 720 to receive ECC information for ECC encoded data indicating multiple errors. Multiple error component 722-4 may be arranged to separately identify an error location and/or value for each error up to at least t.

According to some examples, multiple error component 722-4 may at least temporarily maintain BMA results 726-f, Chien Search results 726-g and error evaluations 726-h, e.g., in a data structure such as a register. For these examples, if the ECC used to encode the ECC encoded data was an RS code or a binary BCH code, both BMA results 726-f and Chien Search results 726-g may be used by multiple error component 722-4 to identify separate error locations. If the ECC used was RS code, then error evaluations 726-h may include error values associated with the separately identified error locations.

Apparatus 700 may also include a buffer component 722-5. Buffer component 722-5 may be arranged for execution by circuitry 720 to maintain a memory capable of temporarily storing the ECC encoded data received in codeword 710.

According to some examples, apparatus 700 may also include a corrector component 722-6. Corrector component 722-6 may be arranged for execution by circuitry 720 to receive the identified error location(s)/value(s) receive from single error component 722-2, double error component 722-3 or multiple error component 722-4. Corrector component 722-6 may also be arranged to obtain the ECC encoded data from the memory maintained by buffer component 722-5 and then correct the ECC encoded data included in codeword 710. The corrected ECC encoded data may then be decoded.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 8 illustrates a logic flow 800. Logic flow 800 may be representative of some or all of the operations executed by one or more logic, features, or devices described herein, such as apparatus 700. More particularly, logic flow 800 may be implemented by error checking component 722-1, single error component 722-2, double error component 722-3, multiple error component 722-4, buffer component 722-5 or corrector component 722-6.

According to some examples, logic flow 800 may receive ECC information for ECC encoded data indicating one or more errors in the ECC encoded data at block 802. For these examples, single error component 722-2 may receive the ECC information as partial syndromes having at least some non-zero values that indicate one or more errors in the ECC encoded data.

In some examples, logic flow 800 may determine whether the encoded data includes a single error or two errors at block 804.

According to some examples, based on a determination of a single error, logic flow 800 may identify an error location for the single error in the ECC encoded data or generate a first indication (e.g., a flag) that the ECC encoded data has more than one error at block 806. If a single error was determined, logic flow 800 may correct the single error based on the identified error location and decode the ECC encoded data at block 808.

In some examples, based on a determination of two errors, logic flow 800 may identify a first location and a second location for the two errors in the ECC encoded data or generate a second indication that the ECC encoded data has more than two errors at block 810. If two errors was determined, logic flow 800 may correct the two errors based on the identified first and second error locations and decode the ECC encoded data at block 812.

In some examples, logic flow 800 at block 814 may identify separate error locations for the more than two errors in the ECC encoded data responsive to the second indication generated by logic flow 800 at block 810. For these examples, double error component 722-3 may have generated the second indication to indicate the more than two errors. Also, identification of the separate error locations may include use of BMA results 726-f and Chien Search results 726-g maintained at multiple error component 722-4.

According to some examples, logic flow 800 may then correct the more than two errors based on the separately identified error locations and decode the ECC encoded data at block 816. Logic flow 800 may then correct the ECC encoded data at block 816. For these examples, corrector component 722-6 may receive the separately identified error locations and correct the ECC encoded data that may have been temporarily stored at a memory maintained by buffer component 722-5. The corrected ECC encoded data may then be decoded by corrector component 722-6.

FIG. 9 illustrates an embodiment of a storage medium 900. The storage medium 900 may comprise an article of manufacture. In some examples, storage medium 900 may include any non-transitory computer readable medium or machine readable medium, such as an optical, magnetic or semiconductor storage. Storage medium 900 may store various types of computer executable instructions, such as instructions to implement logic flow 800. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

FIG. 10 illustrates an example computing platform 1000. In some examples, as shown in FIG. 10, computing platform 1000 may include a memory system 1030, a processing component 1040, other platform components 1050 or a communications interface 1060. According to some examples, computing platform 1000 may be implemented in a computing device.

According to some examples, memory system 1030 may be similar to memory system 100. For these examples, logic and/or features (e.g., included in an ECC decoder/controller) resident at or located with memory system 1030 may execute at least some processing operations or logic for apparatus 700. Also, memory system 1030 may include volatile or non-volatile types of memory (not shown) that may store ECC encoded data written to or read from in a similar manner as described above for memory 120 included in memory system 100.

According to some examples, processing component 1040 may also execute at least some processing operations or logic for apparatus 700 and/or storage medium 900. Processing component 1040 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1050 may include common computing elements, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units associated with either other platform components 1050 or memory system 1030 may include without limitation, various types of computer readable and machine readable storage media in the form of one or more higher speed memory units, such as read-only memory (ROM), RAM, DRAM, Double-Data-Rate DRAM (DDRAM), synchronous DRAM (SDRAM), SRAM, programmable ROM (PROM), erasable programmable ROM (EPROM), electrically erasable programmable ROM (EEPROM), flash memory, nanowires, ferroelectric transistor random access memory (FeTRAM or FeRAM), polymer memory such as ferroelectric polymer memory, ovonic memory, 3-dimensional cross-point memory or ferroelectric memory, silicon-oxide-nitride-oxide-silicon (SONOS) memory, nanowire, magnetic or optical cards, an array of devices such as Redundant Array of Independent Disks (RAID) drives, solid state memory devices (e.g., USB memory), solid state drives (SSD) and any other type of storage media suitable for storing information.

In some examples, communications interface 1060 may include logic and/or features to support a communication interface. For these examples, communications interface 1060 may include one or more communication interfaces that operate according to various communication protocols or standards to communicate over direct or network communication links. Direct communications may occur via use of communication protocols or standards described in one or more industry standards (including progenies and variants) such as those associated with the System Management Bus (SMBus) specification, the PCI Express (PCIe) specification, the Non-Volatile Memory Express (NVMe) specification, the Serial Advanced Technology Attachment (SATA) specification, Serial Attached SCSI (SAS) or the Universal Serial Bus (USB) specification. Network communications may occur via use of communication protocols or standards such those described in the Ethernet standard.

Computing platform 1000 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1000 described herein, may be included or omitted in various embodiments of computing platform 1000, as suitably desired.

The components and features of computing platform 1000 may be implemented using any combination of discrete circuitry, application specific integrated circuits (ASICs), logic gates and/or single chip architectures. Further, the features of computing platform 1000 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the exemplary computing platform 1000 shown in the block diagram of FIG. 10 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

In some examples, example methods may include receiving, at circuitry for a memory, ECC information for ECC encoded data indicating one or more errors in the ECC encoded data. A determination as to whether the ECC encoded data includes a single error or two errors may be made. Based on a determination of a single error, an error location for the single error in the ECC encoded data may be identified or a first indication that the ECC encoded data has more than one error may be generated. Also, for the example methods, based on a determination of two errors a first location and a second location for the two errors in the ECC encoded data may be identified or a second indication that the ECC encoded data has more than two errors may be generated According to some examples for the example methods, the single error may be corrected based on the identified error location or the two errors may be corrected based on the identified first and second locations. The ECC encoded data may then be decoded.

In some examples for the example methods, the ECC may include one of a RS code or a binary BCH code.

According to some examples for the example methods, based on the ECC including the RS code, an error value associated with the identified error location for the single error may be identified or first and second error values associated with the first and second locations for the two errors may be identified.

In some examples for the example methods, determining that the ECC encoded data has the one or more errors may be based on a syndrome check associated with one of the RS code or the binary BCH code.

In some examples for the example methods, identifying separate error locations for the more than two errors included in the ECC encoded data responsive to the second indication may include correcting the more than one error based on the separately identified error locations and decoding the ECC encoded data. For these examples, the ECC may include one or a RS code or a binary BCH code. Also, the separate error locations for the more than two errors may include implementing a BMA and a Chien Search to separately identify error values and locations. Also, for these examples, identifying an error value associated with a given identified error location may be based on the ECC including the RS code.

According to some examples for the example methods, identifying the error value and the given identified error location for the single error may be based on implementing an algorithm that includes $$e = \frac{S_n^2}{S_{2n}}$$

and $$j = \log \frac{S_{n+1}}{S_n},$$

where e is the error value, j is the given identified error location, S represents partial syndromes included in the received ECC information and n represents any positive integer.

In some examples for the example methods, the ECC encoded data encoded may be encoded using the binary BCH code. Identifying the error location for the single error may be based on implementing an algorithm that includes $j = \log S_1$, where j is the given identified error location and S represents partial syndromes included in the received ECC information.

In some examples for the example methods, the ECC encoded data may be associated with one of storage to a memory device, storage to a storage medium, wireless communications or 2-dimensional bar code readers.

According to some examples for the example methods, the memory device may include non-volatile memory such as 3-dimension cross-point memory, flash memory, ferroelectric memory, SONOS memory, polymer memory, nanowire, FeTRAM, FeRAM, or EEPROM.

According to some examples, at least one machine readable medium comprising a plurality of instructions that in response to being executed on a system cause the system to carry out the example method as mentioned above.

According to some examples, an example apparatus may include circuitry for a memory system. A single error component for execution by the circuitry may receive ECC information for ECC encoded data indicating one or more errors in the ECC encoded data. The single error component may also determine whether the ECC encoded data includes a single error, identify a location of the error in the ECC encoded data when the encoded data was determined to have the single error or generate a flag to indicate the ECC encoded data has more than one error. The example apparatus may also include a double error component for execution by the circuitry to receive the ECC information. The double error component may determine whether the ECC encoded data includes two errors, identify a first location and a second location of errors in the ECC encoded data based on a determination of the ECC encoded data having the two errors or generate a second indication that the ECC encoded data has more than two errors. The example apparatus may also include a multiple error component for execution by the circuitry to receive the ECC information for the ECC encoded data indicating one or more errors and separately identify an error location for each error. The example apparatus may also include a corrector component for execution by the circuitry to receive one of the identified locations for the single error, the identified first and second locations for the two errors or the separately identified error locations for the more than two errors and correct the one or more errors in the ECC encoded data.

In some examples, the example apparatus may also include a buffer component for execution by the circuitry to maintain a memory capable of temporarily storing the ECC encoded data for correction by the corrector component.

In some examples, the example apparatus may also include an error checking component for execution by the circuitry to determine that the ECC encoded data has the one or more errors and generate the ECC information to indicate the one or more errors in the ECC encoded data.

According to some examples for the example apparatus, the ECC may include one of a RS code or a binary BCH code.

In some examples for the example apparatus, the multiple error component capable of implementing a BMA and Chien Search to separately identify error locations for the more than two errors.

According to some examples for the example apparatus, the single error component, the double error component and the multiple error component configured to identify an error value associated with a given identified error location based on the ECC encoded data encoded using the RS code.

In some examples for the example apparatus, the single error component may be configured to identify the error value and the given identified error location for the single error based on implementing an algorithm that includes $$e = \frac{S_n^2}{S_{2n}}$$

and $$j = \log \frac{S_{n+1}}{S_n},$$

where e is the error value, j is the given identified error location, S represents partial syndromes included in the received ECC information and n represents any positive integer.

According to some examples for the example apparatus, the ECC encoded data may be encoded using the binary BCH code. For these examples, the single error component may be configured to identify the location of the error in the ECC encoded data based on implementing an algorithm that includes j=log $S_1$, where j is the given identified error location and S represents partial syndromes included in the received ECC information.

In some examples for the example apparatus, the ECC encoded data associated with one of storage to a memory device, storage to a storage medium, wireless communications or 2-dimensional bar code readers.

According to some examples for the example apparatus, the memory device to include non-volatile memory comprising 3-dimensional cross-point memory, flash memory, ferroelectric memory, SONOS memory, polymer memory, nanowire, FeTRAM, FeRAM, or EEPROM.

In some examples for the example apparatus, the memory device may be a two level memory (2LM) system for a computing device. For these examples the 2LM system may also include volatile memory.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
   circuitry for a memory system;
   a single error component for execution by the circuitry to receive error correction code (ECC) information for ECC encoded data, and identify a location of a single error in the ECC encoded data or when more than a single error generate a first indication of multiple errors;
   a double error component for execution by the circuitry to receive the ECC information, and identify locations for two errors in the ECC encoded data or when more than two errors generate a second indication of multiple errors;
   a multiple error component for execution by the circuitry to receive the ECC information and separately identify locations for each of the more than two errors; and
   a corrector component for execution by the circuitry to receive identified locations for the one or more errors and correct one or more errors in the ECC encoded data.

2. The apparatus of claim 1, the corrector component to receive first and second error location indications for two errors in the ECC encoded data based on the single error component generating the first indication of multiple errors.

3. The apparatus of claim 1, the corrector component to receive the second indication of multiple errors in the ECC encoded data based on the double error component generating the second indication of multiple errors.

4. The apparatus of claim 1, comprising:
   a buffer component arranged for execution by the circuitry to maintain a memory capable of temporarily storing the ECC encoded data for correction by the corrector component.

5. The apparatus of claim 1, comprising ECC for the ECC encoded data to include one of a Reed-Solomon (RS) code or a binary Bose, Chaudhuri, and Hocquenghem (BCH) code.

6. The apparatus of claim 3, comprising the multiple error component capable of implementing a Berlekamp-Massey algorithm (BMA) and a Chien Search to separately identify error locations for the more than two errors.

7. The apparatus of claim 6, comprising the single error component, double error component and the multiple error component configured to identify an error value associated with a given identified error location based on the ECC encoded data encoded using a Reed-Solomon (RS) code.

8. The apparatus of claim 6, comprising the ECC encoded data associated with at least one of storage to the memory system, storage to a storage medium, wireless communications or 2-dimensional bar code readers.

9. The apparatus of claim 1, the memory system to include non-volatile memory comprising at least one of 3-dimensional cross-point memory, flash memory, ferroelectric memory, silicon-oxide-nitride-oxide-silicon (SONOS) memory, polymer memory, nanowire, ferroelectric transistor random access memory (FeTRAM or FeRAM), nanowire or electrically erasable programmable read-only memory (EEPROM).

10. The apparatus of claim 9, the memory system comprising a two level memory (2LM) system for a computing device, the 2LM system to also include volatile memory.

11. The apparatus of claim 1, comprising:
    an error checking component for execution by the circuitry to determine that the ECC encoded data has the one or more errors and generate the ECC information to indicate the one or more errors in the ECC encoded data.

12. A method comprising:
    receiving, at circuitry for a memory system, error correction code (ECC) information for ECC encoded data indicating one or more errors in the ECC encoded data;
    determining whether the ECC encoded data includes a single error or multiple errors;
    based on the determination, identifying an error location for a single error in the ECC encoded data or generating a first indication that the ECC encoded data has more than one error;

based on the determination, identifying a first location and a second location for two errors in the ECC encoded data or generating a second indication that the ECC encoded data has more than two errors;

based on the second indication, identifying separate locations for each of the more than two errors; and correcting the single error, the two errors or the more than two errors based respectively on the error location for the single error, the first location and the second location for the two errors, or the separate locations for each of the more than two errors.

13. The method of claim 12, comprising ECC for the ECC encoded data to include one of a Reed-Solomon (RS) code or a binary Bose, Chaudhuri, and Hocquenghem (BCH) code.

14. The method of claim 13, based on the ECC for the ECC encoded data including a Reed-Solomon (RS) code, identifying an error value associated with the identified error location for the single error, identifying respective first and second error values associated with first and the second locations for the two errors, or identifying the separate locations for each of the more than two errors.

15. The method of claim 12, comprising:
determining that the ECC encoded data has the single error or multiple errors based on a syndrome check associated with one of Reed-Solomon (RS) code or binary Bose, Chaudhuri, and Hocquenghem (BCH) code.

16. The method of claim 15, identifying separate error locations for the more than two errors comprises implementing a Berlekamp-Massey algorithm (BMA) and a Chien Search to separately identify error values and locations.

17. The method of claim 15, comprising:
identifying an error value associated with a given identified error location based on the ECC for the ECC encoded data including a Reed-Solomon (RS) code.

18. The method of claim 12, comprising the ECC encoded data associated with at least one of storage to the memory system, storage to a storage medium, wireless communications or a 2-dimentional bar code reader.

19. The method of claim 18, the memory system to include non-volatile memory comprising at least one of 3-dimensional cross-point memory, flash memory, ferroelectric memory, silicon-oxide-nitride-oxide-silicon (SONOS) memory, polymer memory, nanowire, ferroelectric transistor random access memory (FeTRAM or FeRAM), nanowire, or electrically erasable programmable read-only memory (EEPROM).

20. At least one non-transitory machine readable medium comprising a plurality of instructions that in response to being executed on a system cause the system to:

receive error correction code (ECC) information for ECC encoded data indicating one or more errors in the ECC encoded data;

determine whether the ECC encoded data includes a single error or a double error;

based on the determination, identify an error location for the single error in the ECC encoded data and generate a first flag, identify respective first and second error locations for two errors in the ECC encoded data, or generate a second flag to indicate the ECC encoded data has more than two errors; and based on the second flag, identify separate locations for each of the more than two errors; and correct the single error, the two errors or the more than two errors based respectively on the error location for the single error, the first location and the second location for the two errors, or the separate locations for each of the more than two errors.

21. The at least one machine readable medium of claim 20, comprising ECC for the ECC encoded data to include one of a Reed-Solomon (RS) code or a binary Bose, Chaudhuri, and Hocquenghem (BCH) code.

* * * * *